United States Patent
Chen

(10) Patent No.: US 12,034,394 B2
(45) Date of Patent: Jul. 9, 2024

(54) MOTOR DRIVER USING CORRECTING MECHANISM ON SENSED MOTOR POSITION

(71) Applicant: ANPEC ELECTRONICS CORPORATION, Hsinchu (TW)

(72) Inventor: Kun-Min Chen, Hsinchu (TW)

(73) Assignee: ANPEC ELECTRONICS CORPORATION, Hsinchu (TW)

(*) Notice: Subject to any disclaimer, the term of this patent is extended or adjusted under 35 U.S.C. 154(b) by 135 days.

(21) Appl. No.: 17/978,951

(22) Filed: Nov. 1, 2022

(65) Prior Publication Data

US 2024/0072692 A1  Feb. 29, 2024

(30) Foreign Application Priority Data

Aug. 31, 2022 (TW) .................................. 111132799

(51) Int. Cl.
*H02P 6/16* (2016.01)
*G01B 7/30* (2006.01)
*G01D 5/14* (2006.01)
*G01R 25/00* (2006.01)

(52) U.S. Cl.
CPC .................. *H02P 6/16* (2013.01); *G01B 7/30* (2013.01); *G01D 5/145* (2013.01); *G01R 25/00* (2013.01)

(58) Field of Classification Search
CPC ........ G01D 5/145; G01D 5/2454; H02P 6/00; H02P 6/005; H02P 6/007; H02P 6/04; H02P 6/06; H02P 6/08; H02P 6/12; H02P 6/14; H02P 6/16; H02P 6/182; H02P 6/188; H02P 6/28; H02P 6/32; H02P 7/0094; H02P 7/29; H02P 8/08; H02P 8/10; H02P 8/18; H02P 25/026; H02P 25/03; H02P 25/062; H02P 26/064; H02P 25/08; H02P 25/086; H02P 25/089; H02P 25/10; H02P 27/06; H02P 27/08; H02P 21/18; H02K 29/08
See application file for complete search history.

(56) References Cited

U.S. PATENT DOCUMENTS

2013/0113400 A1* 5/2013 Kishimoto ................ H02P 6/16
318/400.14

* cited by examiner

*Primary Examiner* — Antony M Paul
(74) *Attorney, Agent, or Firm* — Li & Cai Intellectual Property Office

(57) ABSTRACT

A motor driver using a correcting mechanism on a sensed motor position is provided. A rotor position detector circuit senses a position of a rotor of a motor to output a commutation signal. A back electromotive force detector circuit detects a back electromotive force signal of the motor. An actual phase difference calculator circuit calculates a phase difference between the back electromotive force signal and the commutation signal as an actual phase difference. An error phase angle calculator circuit calculates a difference between the actual phase difference and a reference phase difference as an error phase angle. A motor driving circuit corrects the commutation signal according to the error phase angle. The motor driving circuit determines the position of the rotor of the motor to drive the motor according to the corrected commutation signal.

15 Claims, 7 Drawing Sheets

MOTOR DRIVER USING CORRECTING MECHANISM ON SENSED MOTOR POSITION

CROSS-REFERENCE TO RELATED PATENT APPLICATION

This application claims the benefit of priority to Taiwan Patent Application No. 111132799, filed on Aug. 31, 2022. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a motor, and more particularly to a motor driver using a correcting mechanism on a sensed motor position.

BACKGROUND OF THE DISCLOSURE

In electronic devices, fans are used to cool heat generating components such as processors. When the heat generating components are cooled down by the fans, sensors such as Hall sensors must sense correct data of motors of the fans such that motors of the fans can be precisely driven to rotate according to the correct data by motor drivers. However, an error may exist between an actual position of the sensor assembled in the fan and an ideal position, which may cause the sensor assembled in the fan to sense incorrect data. As a result, the motor driver may not be able to drive the motor to rotate with an optimum efficiency according to the incorrect data sensed by the sensor.

SUMMARY OF THE DISCLOSURE

In response to the above-referenced technical inadequacies, the present disclosure provides a motor driver using a correcting mechanism on a sensed motor position. The motor driver includes a rotor position detector circuit, a back electromotive force detector circuit, an actual phase difference calculator circuit, an error phase angle calculator circuit and a motor driving circuit. The rotor position detector circuit is disposed on a motor. The rotor position detector circuit is configured to sense a position of a rotor of the motor to output a commutation signal. The back electromotive force detector circuit is connected to the motor. The back electromotive force detector circuit is configured to detect back electromotive force of the motor to output a back electromotive force signal. The actual phase difference calculator circuit is connected to the back electromotive force detector circuit. The actual phase difference calculator circuit is configured to calculate a phase difference between the back electromotive force signal and the commutation signal as an actual phase difference. The error phase angle calculator circuit is connected to the actual phase difference calculator circuit. The error phase angle calculator circuit is configured to calculate a difference between the actual phase difference and a reference phase difference as an error phase angle. The motor driving circuit is connected to the rotor position detector circuit and the error phase angle calculator circuit. The motor driving circuit is configured to correct the commutation signal according to the error phase angle. The motor driving circuit is configured to determine the position of the rotor of the motor to drive the motor according to the commutation signal that is corrected.

In certain embodiments, the motor driver further includes a storing circuit. The storing circuit is connected to the error phase angle calculator circuit. The storing circuit is configured to store the error phase angle.

In certain embodiments, the motor driving circuit is connected to the storing circuit. The motor driving circuit is configured to correct the commutation signal according to the error phase angle stored in the storing circuit.

In certain embodiments, the motor is a single-phase motor.

In certain embodiments, the motor is a three-phase motor.

In certain embodiments, the back electromotive force detector circuit detects a first back electromotive force signal of a first terminal of the motor, a second back electromotive force signal of a second terminal of the motor, a third back electromotive force signal of a third terminal of the motor or any combination thereof.

In certain embodiments, the rotor position detector circuit includes a first rotor position detector, a second rotor position detector, a third rotor position detector or any combination thereof. The first rotor position detector is disposed corresponding to the first terminal of the motor. The first rotor position detector is configured to detect the position of the rotor of the motor to output a first commutation signal. The second rotor position detector is disposed corresponding to the second terminal of the motor. The second rotor position detector is configured to detect the position of the rotor of the motor to output a second commutation signal. The third rotor position detector is disposed corresponding to the third terminal of the motor. The third rotor position detector is configured to detect the position of the rotor of the motor to output a third commutation signal.

In certain embodiments, the actual phase difference calculator circuit calculates a phase difference between the first back electromotive force signal and the first commutation signal as a first actual phase difference, and/or calculates a phase difference between the second back electromotive force signal and the second commutation signal as a second actual phase difference, and/or calculates a phase difference between the third back electromotive force signal and the third commutation signal as a third actual phase difference.

In certain embodiments, the actual phase difference calculator circuit calculates an average value of the first actual phase difference, the second actual phase difference and the third actual phase difference as an actual average phase difference. The error phase angle calculator circuit calculates a difference between the actual average phase difference and the reference phase difference as the error phase angle.

In certain embodiments, the error phase angle calculator circuit calculates a difference between the first actual phase difference and the reference phase difference as a first error phase angle, and/or calculates a difference between the second actual phase difference and the reference phase difference as a second error phase angle, and/or calculates a difference between the third actual phase difference and the reference phase difference as a third error phase angle.

In certain embodiments, the motor driver further includes a storing circuit. The storing circuit is connected to the error phase angle calculator circuit. The storing circuit is configured to store the first error phase angle, the second error phase angle, the third error phase angle or any combination thereof.

In certain embodiments, the motor driving circuit corrects the first commutation signal according to the first error phase angle, and/or corrects the second commutation signal according to the second error phase angle, and/or corrects the third commutation signal according to the third error phase angle.

In certain embodiments, the motor driving circuit drives the motor according to the first error phase angle that is corrected, the second error phase angle that is corrected, the third error phase angle that is corrected or any combination thereof.

In certain embodiments, the motor driving circuit calculates an average value of the first error phase angle, the second error phase angle and the third error phase angle. The motor driving circuit corrects the first commutation signal, the second commutation signal, the third commutation signal according to the average value or any combination thereof.

In certain embodiments, the motor driving circuit drives the motor according to the first error phase angle that is corrected, the second error phase angle that is corrected, the third error phase angle that is corrected or any combination thereof.

As described above, the present disclosure provides the motor driver using the correcting mechanism on the sensed motor position. The motor driver of the present disclosure, according to the phase difference between the back electromotive force signal and the commutation signal of the motor, corrects the error in the detected commutation signal that is caused by the error between an actual position of the rotor position detector circuit (such as a Hall sensor) and an ideal position. The motor driver of the present disclosure drives the motor such that a current signal of the motor is aligned with the back electromotive force signal of the motor according to the corrected commutation signal. As a result, the motor can rotate with an optimum efficiency.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
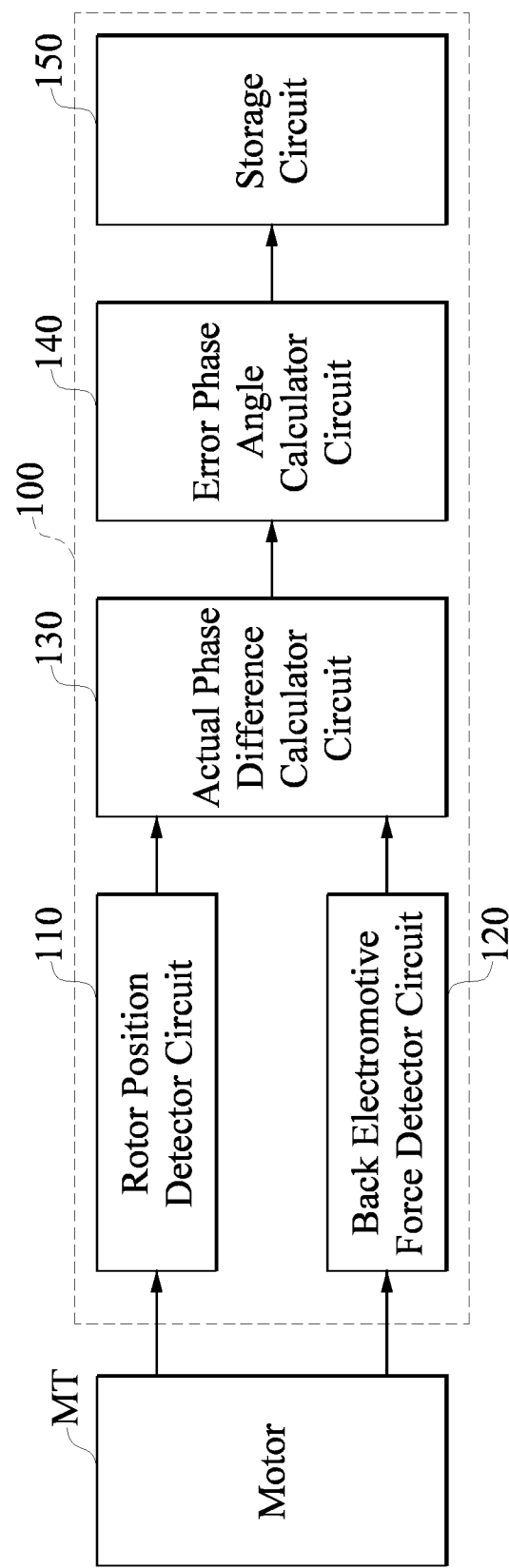
FIG. 1 is a block diagram of a motor position detection correcting circuit of a motor driver using a correcting mechanism on a sensed motor position according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Reference is made to FIG. 1, which is a block diagram of a motor position detection correcting circuit of a motor driver using a correcting mechanism on a sensed motor position according to an embodiment of the present disclosure.

The motor driver of the embodiment of the present disclosure may include a motor position detection correcting circuit 100 that is applicable to detect data of a motor MT and to correct the detected data of the motor MT.

The motor position detection correcting circuit 100 may include a rotor position detector circuit 110, a back electromotive force detector circuit 120, an actual phase difference calculator circuit 130, and an error phase angle calculator circuit 140. If necessary, the motor position detection correcting circuit 100 may further include a storing circuit 150.

The rotor position detector circuit 110 is disposed on the motor MT. The back electromotive force detector circuit 120 may be electrically connected to or contacted with the motor MT. The actual phase difference calculator circuit 130 may be connected to the rotor position detector circuit 110, the back electromotive force detector circuit 120 and the error phase angle calculator circuit 140. The storing circuit 150 may be connected to the error phase angle calculator circuit 140.

The rotor position detector circuit 110 may detect the position of the rotor of the motor MT. The rotor position detector circuit 110 may determine a commutation state of the motor MT to output a commutation signal according to the position of the rotor of the motor MT. The back electromotive force detector circuit 120 may detect back electromotive force of the motor MT to output a back electromotive force signal.

The actual phase difference calculator circuit 130 may calculate a phase difference between the back electromotive force signal from the back electromotive force detector circuit 120 and the commutation signal from the rotor position detector circuit 110 as an actual phase difference.

The error phase angle calculator circuit 140 may calculate a difference between the actual phase difference from the actual phase difference calculator circuit 130 and a reference phase difference (from an external circuit) as an error phase angle.

If necessary, the storing circuit 150 may store the error phase angle from the error phase angle calculator circuit 140. In addition, the storing circuit 150 may store the actual phase difference, the reference phase difference, the commutation signal, the back electromotive force signal and so on.

The error phase angle calculator circuit 140 or the storing circuit 150 of the motor position detection correcting circuit 100 may be connected to a motor driving circuit. The motor driving circuit may be connected to the motor MT. The motor driving circuit may correct the commutation signal outputted by the rotor position detector circuit 110, according to the error phase angle from the error phase angle calculator circuit 140 or the storing circuit 150. The motor driving circuit may determine the position of the rotor of the motor MT to drive the motor MT according to the corrected commutation signal.

Figure 2:
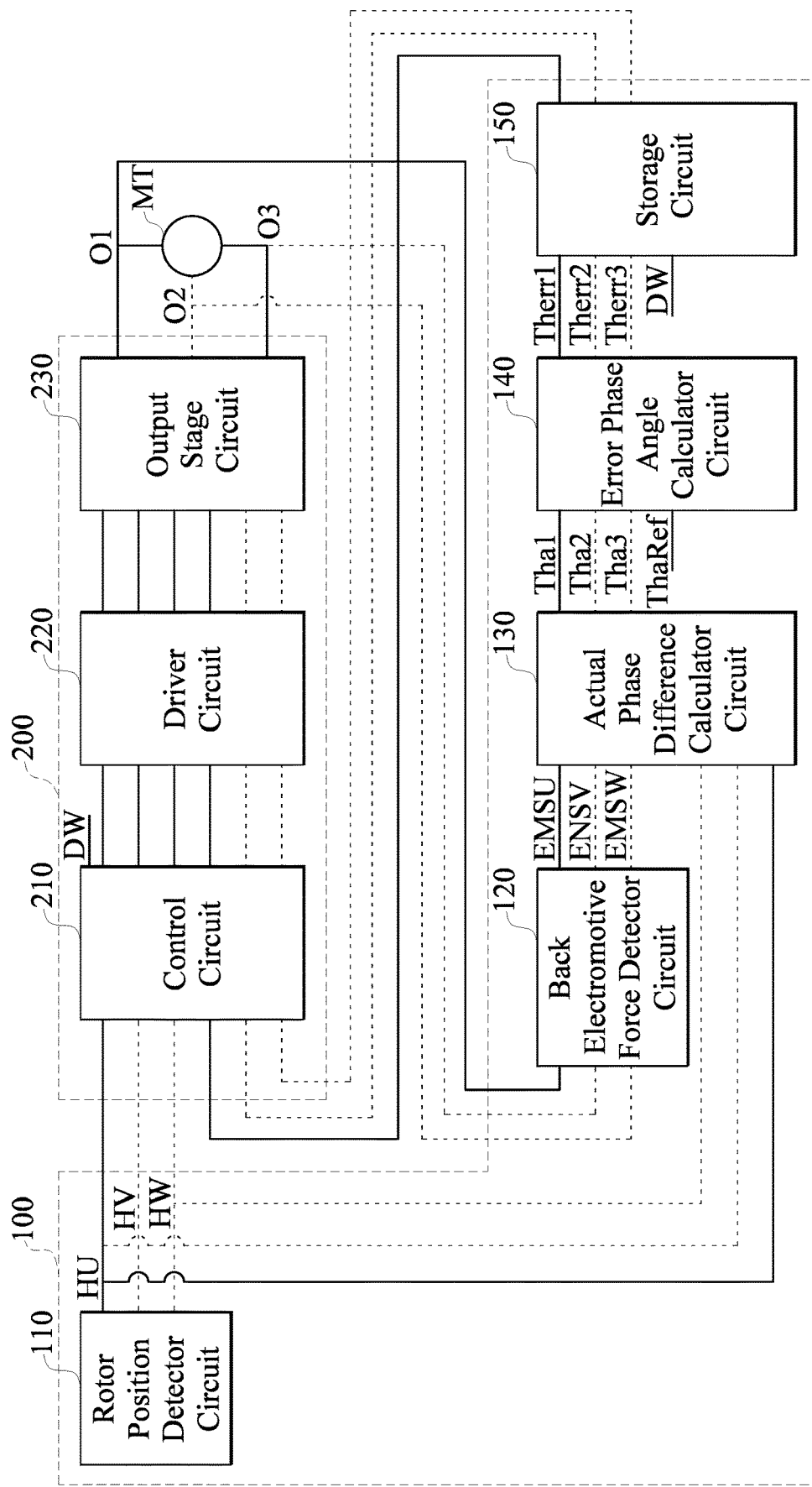
FIG. 2 is a block diagram of a motor and the motor driver using the correcting mechanism on the sensed motor position according to the embodiment of the present disclosure.
Figure 3:
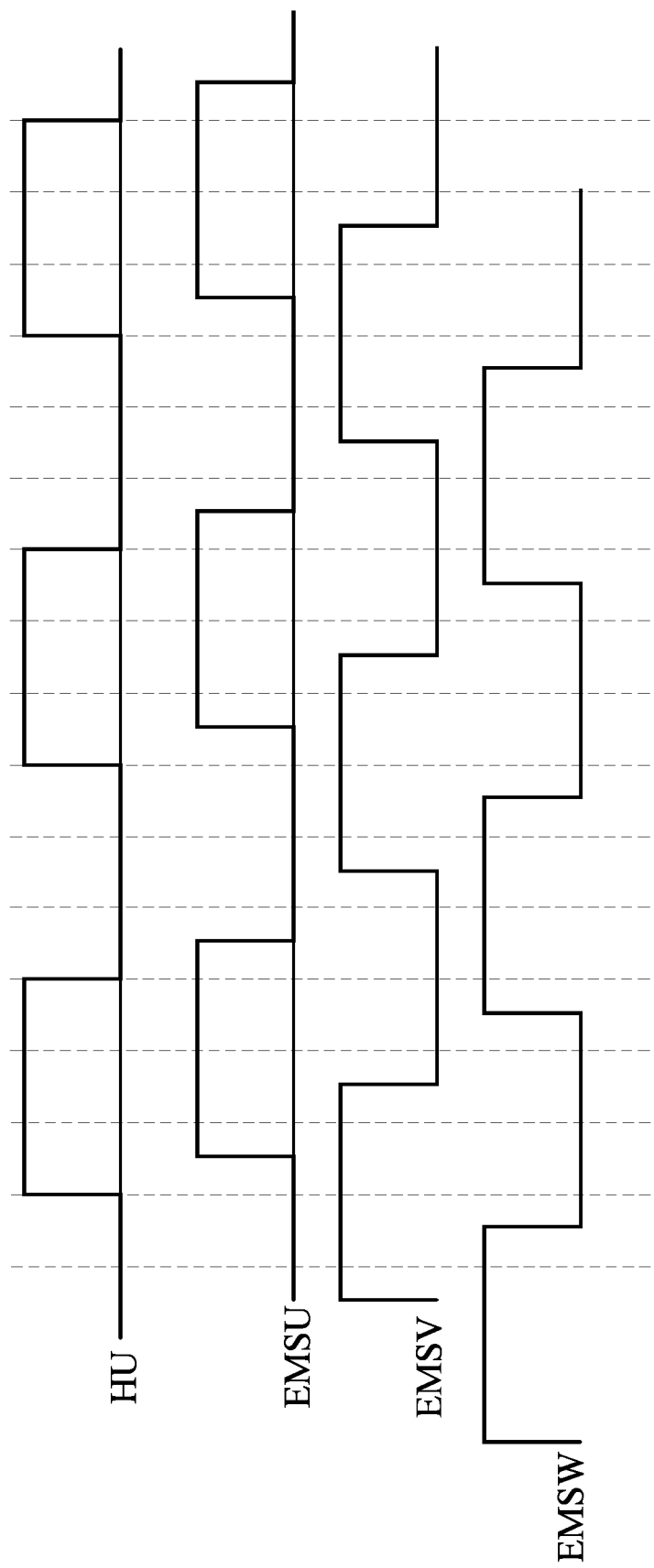
FIG. 3 is a waveform diagram of back electromotive force signals of three-phases of the motor and a Hall signal of a U-phase of the three-phases of the motor that are detected by the motor driver using the correcting mechanism on the sensed motor position according to the embodiment of the present disclosure.
Figure 4:
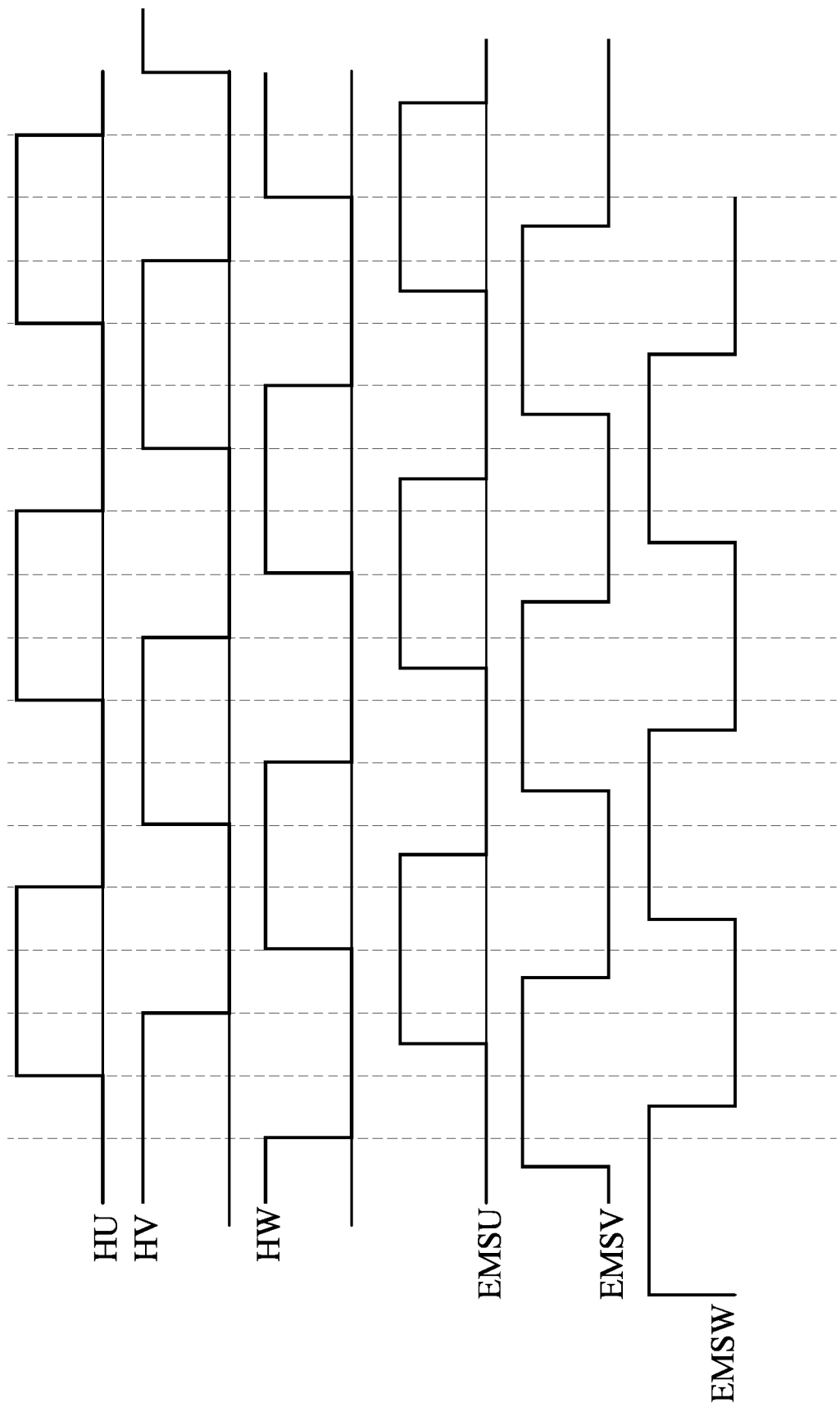
FIG. 4 is a waveform diagram of the back electromotive force signals of the three-phases of the motor and Hall signals of the three-phases of the motor that are detected by the motor driver using the correcting mechanism on the sensed motor position according to the embodiment of the present disclosure.

Reference is made to FIGS. 2 to 4, in which FIG. 2 is a block diagram of a motor and the motor driver using the correcting mechanism on the sensed motor position according to the embodiment of the present disclosure, FIG. 3 is a waveform diagram of back electromotive force signals of three-phases of the motor and a Hall signal of a U-phase of the three-phases of the motor that are detected by the motor driver using the correcting mechanism on the sensed motor position according to the embodiment of the present disclosure, and FIG. 4 is a waveform diagram of the back electromotive force signals of the three-phases of the motor and Hall signals of the three-phases of the motor that are detected by the motor driver using the correcting mechanism on the sensed motor position according to the embodiment of the present disclosure.

As shown in FIG. 2, the motor driving circuit of the embodiment of the present disclosure includes a motor driving circuit 200. It is worth noting that, the motor driving circuit of the embodiment of the present disclosure further includes the motor position detection correcting circuit 100 connected to the motor driving circuit 200. The motor driving circuit 200 is connected to the motor MT.

The motor driving circuit 200 may include a control circuit 210, a driver circuit 220 and an output stage circuit 230. As shown in FIG. 2, the control circuit 210 of the motor driving circuit 200 may be connected to the storing circuit 150 of the motor position detection correcting circuit 100. In practice, the control circuit 210 may be directly connected to the error phase angle calculator circuit 140.

The control circuit 210 of the motor driving circuit 200 may be connected to the rotor position detector circuit 110 of the motor position detection correcting circuit 100. In the motor driving circuit 200, the driver circuit 220 is connected to the control circuit 210 and the output stage circuit 230. The output stage circuit 230 is connected to the motor MT.

The back electromotive force detector circuit 120 of the motor position detection correcting circuit 100 and the output stage circuit 230 of the motor driving circuit 200 may be connected to a first terminal O1 and a second terminal O2 of the motor MT such as a single-phase motor, or may be connected to the first terminal O1, the second terminal OT2 and a third terminal OT3 of the motor MT such as a three-phase motor.

The rotor position detector circuit 110 may include one or more rotor position detectors such as one or more Hall sensors. If the motor MT is the three-phase motor, the rotor position detector circuit 110 may include a first rotor position detector, a second rotor position detector and a third rotor position detector. The first rotor position detector is disposed corresponding to the first terminal O1 (such as a U-phase terminal) of the motor MT. The second rotor position detector is disposed corresponding to the second terminal O2 (such as a V-phase terminal) of the motor MT. The third rotor position detector is disposed corresponding to the third terminal O3 (such as a W-phase terminal) of the motor MT.

The first rotor position detector may detect the position of the rotor of the motor MT to output a first commutation signal HU as shown in FIGS. 3 and 4. The second rotor position detector may detect the position of the rotor of the motor MT to output a second commutation signal HV as shown in FIG. 4. The third rotor position detector may detect the position of the rotor of the motor MT to output a third commutation signal HW as shown in FIG. 4. In practice, the rotor position detector circuit 110 may only detect one or two of the first commutation signal HU, the second commutation signal HV and the third commutation signal HW.

The back electromotive force detector circuit 120 as shown in FIG. 2 may detect the back electromotive force of the first terminal O1 such as the U-phase terminal of the motor MT to output a first back electromotive force signal EMSU having a plurality of waveforms as shown in FIG. 3 or FIG. 4.

In addition or alternatively, the back electromotive force detector circuit 120 as shown in FIG. 2 may detect the back electromotive force of the second terminal O2 such as the V-phase terminal of the motor MT to output a second back electromotive force signal EMSV having a plurality of waveforms as shown in FIG. 3 or FIG. 4.

In addition or alternatively, the back electromotive force detector circuit 120 as shown in FIG. 2 may detect the back electromotive force of the third terminal O3 such as the W-phase terminal of the motor MT to output a third back electromotive force signal EMSW having a plurality of waveforms as shown in FIG. 3 or FIG. 4.

Then, the actual phase difference calculator circuit 130 may calculate a phase difference between the first back electromotive force signal EMSU and the first commutation signal HU as a first actual phase difference Tha1. In addition or alternatively, the actual phase difference calculator circuit 130 may calculate a phase difference between the second back electromotive force signal EMSV and the second commutation signal HV as a second actual phase difference Tha2. In addition or alternatively, the actual phase difference calculator circuit 130 may calculate a phase difference between the third back electromotive force signal EMSW and the third commutation signal HW as a third actual phase difference Tha3.

Then, the error phase angle calculator circuit 140 may calculate a difference between the first actual phase difference Tha1 and a reference phase difference ThaRef as a first error phase angle Therr1. In addition or alternatively, the error phase angle calculator circuit 140 may calculate a difference between the second actual phase difference Tha2 and the reference phase difference ThaRef as a second error phase angle Therr2. In addition or alternatively, the error phase angle calculator circuit 140 may calculate a difference between the third actual phase difference Tha3 and the reference phase difference ThaRef as a third error phase angle Therr3.

If necessary, the storing circuit 150 of the motor position detection correcting circuit 100 may store the first error phase angle Therr1, the second error phase angle Therr2, the third error phase angle Therr3 or any combination thereof.

The control circuit 210 of the motor driving circuit 200 may obtain the first error phase angle Therr1, the second error phase angle Therr2, the third error phase angle Therr3 or any combination thereof from the error phase angle calculator circuit 140 or the storing circuit 150 of the motor position detection correcting circuit 100.

The control circuit 210 of the motor driving circuit 200 may obtain the first commutation signal HU, the second commutation signal HV and the third commutation signal HW or any combination thereof from the rotor position detector circuit 110 of the motor position detection correcting circuit 100.

The control circuit 210 of the motor driving circuit 200 may correct the first commutation signal HU according to the first error phase angle Therr1, and/or correct the second commutation signal HV according to the second error phase angle Therr2, and/or correct the third commutation signal HW according to the third error phase angle Therr3.

Alternatively, the control circuit 210 of the motor driving circuit 200 may calculate an average value of the first error phase angle Therr1, the second error phase angle Therr2, and the third error phase angle Therr3 as an average error phase angle. The control circuit 210 may, according to the average error phase angle, correct the first commutation signal HU, the second commutation signal HV, the third commutation signal HW or any combination thereof.

Alternatively, the actual phase difference calculator circuit 130 may calculate an average value of the first actual phase difference Tha1, the second actual phase difference Tha2 and the third actual phase difference Tha3 as an actual average phase difference. The error phase angle calculator circuit 140 may calculate a difference between the actual average phase difference and the reference phase difference ThaRef as the error phase angle. The control circuit 210 of the motor driving circuit 200 may, according to the error phase angle, correct the first commutation signal HU, the second commutation signal HV, the third commutation signal HW or any combination thereof.

Then, the control circuit 210 of the motor driving circuit 200 may, according to the first commutation signal HU that is corrected, the second commutation signal HV that is corrected, the third commutation signal HW that is corrected or any combination thereof, determine a state of the motor MT (such as the positon of the rotor of the motor MT) to output one or more control signals. If necessary, the control circuit 210 may output motor state data DW to the storing circuit 150 as shown in FIG. 2, according to the state of the motor MT such as the positon of the rotor of the motor MT and other data. The storing circuit 150 may store the motor state data DW.

Then, the driver circuit 220 of the motor driving circuit 200 may output one or more driving signals according to the one or more control signals from the control circuit 210.

Finally, the output stage circuit 230 of the motor driving circuit 200 may output one or more output stage signals to one or more of the terminals of the motor MT to drive the motor MT, according to the one or more driving signals from the driver circuit 220.

Figure 5:
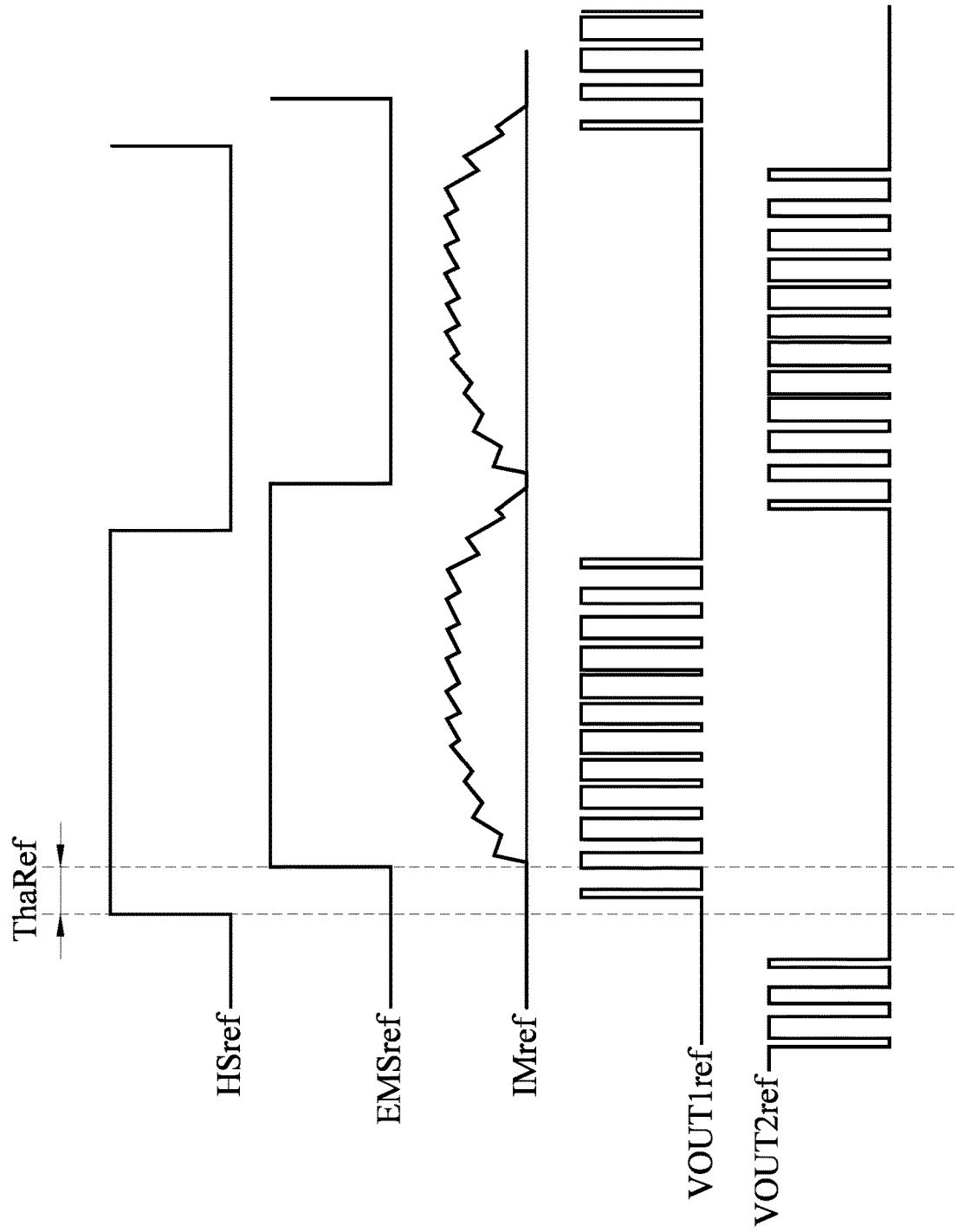
FIG. 5 is a waveform diagram of ideal signals of the motor driver using the correcting mechanism on the sensed motor position according to the embodiment of the present disclosure.
Figure 6:
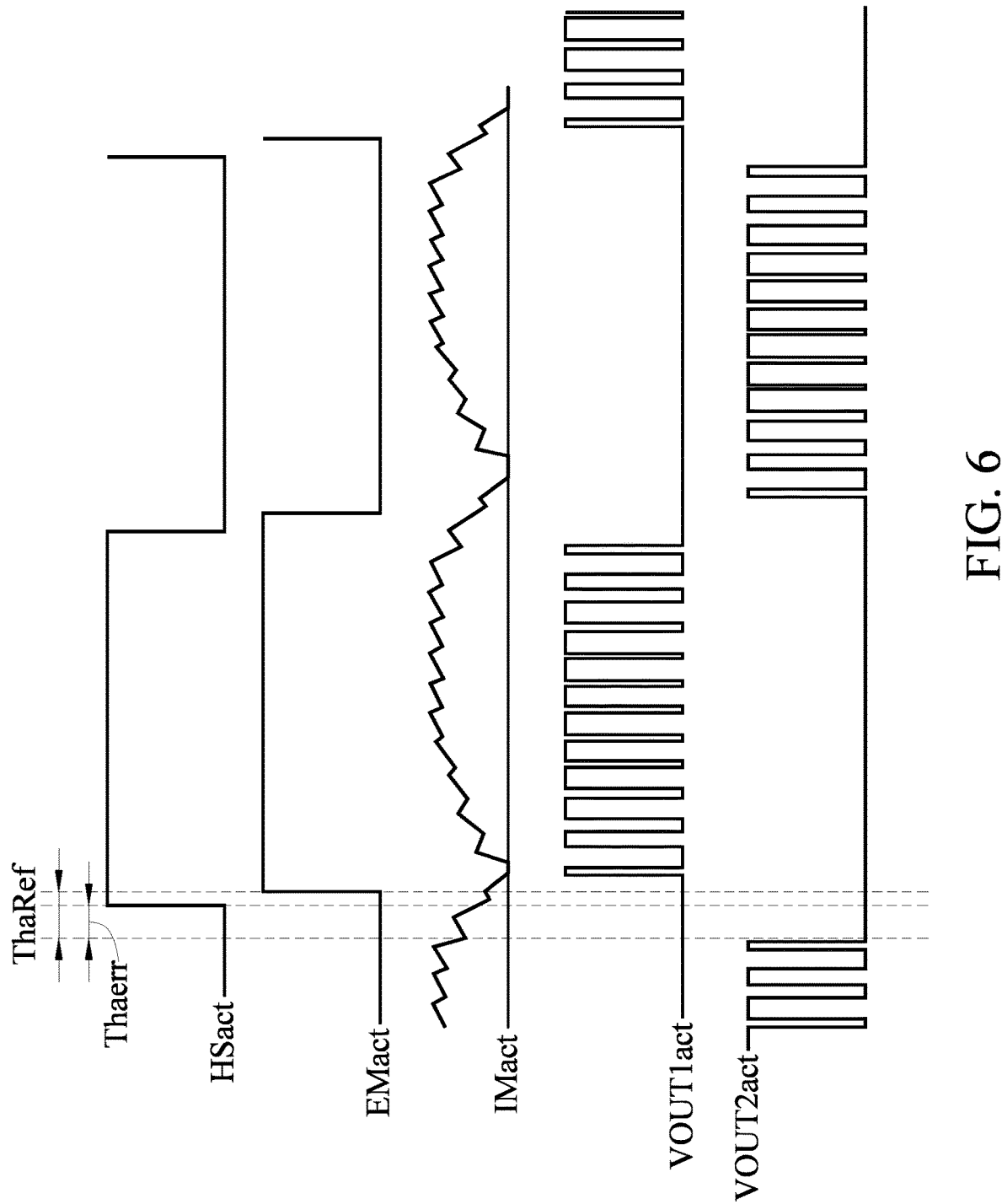
FIG. 6 is a waveform diagram of actual signals that are not corrected by the motor driver using the correcting mechanism on the sensed motor position according to the embodiment of the present disclosure.
Figure 7:
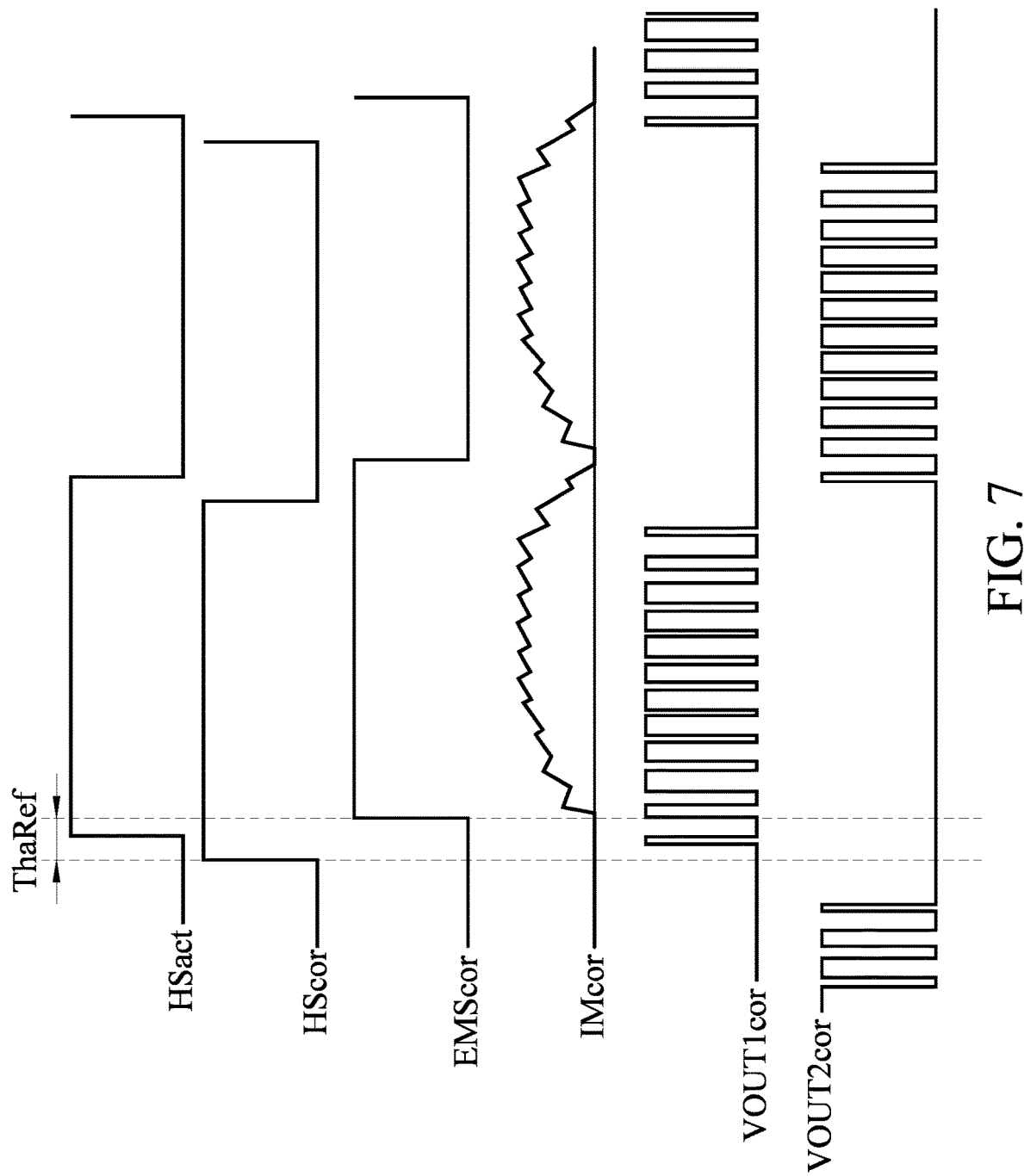
FIG. 7 is a waveform diagram of the actual signal that is not corrected and signals that are corrected by the motor driver using the correcting mechanism on the sensed motor position according to the embodiment of the present disclosure.

Reference is made to FIG. 2 and FIGS. 2 to 7, in which FIG. 5 is a waveform diagram of ideal signals of the motor driver using the correcting mechanism on the sensed motor position according to the embodiment of the present disclosure, FIG. 6 is a waveform diagram of actual signals that are not corrected by the motor driver using the correcting mechanism on the sensed motor position according to the embodiment of the present disclosure, and FIG. 7 is a waveform diagram of the actual signal that is not corrected and signals that are corrected by the motor driver using the correcting mechanism on the sensed motor position according to the embodiment of the present disclosure.

If the rotor position detector circuit 110 such as the Hall sensor is disposed at an ideal position inside a fan, the commutation signal outputted by the Hall sensor is a reference commutation signal HSref as shown in FIG. 5, and the back electromotive force signal of the motor MT is a reference back electromotive force signal EMSref as shown in FIG. 5.

When the rotor position detector circuit 110 is disposed at the ideal position, a current signal generated by the motor MT is a reference motor current signal IMref as shown in FIG. 5. Under this ideal condition, an output voltage signal of the first terminal O1 of the motor MT is a first reference output voltage signal VOUT1ref as shown in FIG. 5, and an output voltage signal of the second terminal O2 of the motor MT is a second reference output voltage signal VOUT2ref as shown in FIG. 5.

It is worth noting that, when the rotor position detector circuit 110 is disposed at the ideal position, a phase difference between the reference commutation signal HSref and the reference back electromotive force signal EMSref is the reference phase difference ThaRef as shown in FIG. 5.

However, an error often exists between an actual position of the rotor position detector circuit 110 such as the Hall sensor inside the fan and the ideal position. When the rotor position detector circuit 110 is disposed at the actual position, the commutation signal outputted by the rotor position detector circuit 110 such as the Hall sensor as shown in FIG. 1 is an actual commutation signal HSact as shown in FIG. 6, and the back electromotive force signal detected by the back electromotive force detector circuit 120 is an actual back electromotive force signal EMact as shown in FIG. 6. As a result, the current signal generated by the motor MT is an actual motor current signal IMact as shown in FIG. 6. The output voltage signal of the first terminal O1 of the motor MT is a first actual output voltage signal VOUT1act as shown in FIG. 6. The output voltage signal of the second terminal O2 of the motor MT is a second actual output voltage signal VOUT2act as shown in FIG. 6.

It is worth noting that, when the rotor position detector circuit 110 is disposed at the actual position, a phase difference between the actual commutation signal HSact and the actual back electromotive force signal EMact is an actual phase difference Thaerr instead of the reference phase difference ThaRef.

If the motor driver determines the position of the rotor of the motor MT to drive the motor MT according to the actual commutation signal HSact, the actual back electromotive force signal EMact of the motor MT is not aligned with the actual motor current signal IMact of the motor MT as shown in FIG. 6, which results in a low operational efficiency of the motor MT.

Therefore, as shown in FIGS. 6 and 7, the actual commutation signal HSact of the motor MT that is detected by the rotor position detector circuit 110 of the motor position detection correcting circuit 100 is corrected to form a compensated commutation signal HScor.

The motor driving circuit 200 can accurately determine the position of the rotor of the motor MT to effectively drive the motor MT according to the compensated commutation signal HScor. As a result, the back electromotive force signal generated by the motor MT is a compensated back electromotive force signal EMScor as shown in FIG. 7. The current signal generated by the motor MT is a compensated motor current signal IMcor as shown in FIG. 7. The output voltage signal of the first terminal O1 of the motor MT is a first compensated output voltage signal VOUT1cor as shown in FIG. 7. The output voltage signal of the second terminal O2 of the motor MT is a second compensated output voltage signal VOUT2cor as shown in FIG. 7. The compensated back electromotive force signal EMScor is aligned with the compensated motor current signal IMcor. As a result, the motor MT being driven by the motor driving circuit 200 rotates with an optimum efficiency.

Beneficial Effects of the Embodiments

In conclusion, the present disclosure provides the motor driver using the correcting mechanism on the sensed motor position. The motor driver of the present disclosure, according to the phase difference between the back electromotive force signal and the commutation signal of the motor, corrects the error in the detected commutation signal that is caused by the error between the actual position of the rotor position detector circuit (such as the Hall sensor) and the ideal position. The motor driver of the present disclosure, according to the corrected commutation signal, drives the motor such that the current signal of the motor is aligned with the back electromotive force signal of the motor. Therefore, the motor can rotate with the optimum efficiency.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A motor driver using a correcting mechanism on a sensed motor position, comprising:
   a rotor position detector circuit disposed on a motor and configured to sense a position of a rotor of the motor to output a commutation signal;
   a back electromotive force detector circuit connected to the motor and configured to detect back electromotive force of the motor to output a back electromotive force signal;
   an actual phase difference calculator circuit connected to the back electromotive force detector circuit, and configured to calculate a phase difference between the back electromotive force signal and the commutation signal as an actual phase difference;
   an error phase angle calculator circuit connected to the actual phase difference calculator circuit, and configured to calculate a difference between the actual phase difference and a reference phase difference as an error phase angle; and
   a motor driving circuit connected to the rotor position detector circuit and the error phase angle calculator circuit, configured to correct the commutation signal according to the error phase angle, and configured to determine the position of the rotor of the motor to drive the motor according to the commutation signal that is corrected.

2. The motor driver according to claim 1, further comprising:
   a storing circuit connected to the error phase angle calculator circuit and configured to store the error phase angle.

3. The motor driver according to claim 2, wherein the motor driving circuit is connected to the storing circuit and configured to correct the commutation signal according to the error phase angle stored in the storing circuit.

4. The motor driver according to claim 1, wherein the motor is a single-phase motor.

5. The motor driver according to claim 1, wherein the motor is a three-phase motor.

6. The motor driver according to claim 1, wherein the back electromotive force detector circuit detects a first back electromotive force signal of a first terminal of the motor, a second back electromotive force signal of a second terminal of the motor, a third back electromotive force signal of a third terminal of the motor or any combination thereof.

7. The motor driver according to claim 6, wherein the rotor position detector circuit includes a first rotor position detector, a second rotor position detector, a third rotor position detector or any combination thereof;
   wherein the first rotor position detector is disposed corresponding to the first terminal of the motor, and configured to detect the position of the rotor of the motor to output a first commutation signal;
   wherein the second rotor position detector is disposed corresponding to the second terminal of the motor, and configured to detect the position of the rotor of the motor to output a second commutation signal;
   wherein the third rotor position detector is disposed corresponding to the third terminal of the motor, and configured to detect the position of the rotor of the motor to output a third commutation signal.

8. The motor driver according to claim 7, wherein the actual phase difference calculator circuit calculates a phase difference between the first back electromotive force signal and the first commutation signal as a first actual phase difference, and/or calculates a phase difference between the second back electromotive force signal and the second commutation signal as a second actual phase difference, and/or calculates a phase difference between the third back electromotive force signal and the third commutation signal as a third actual phase difference.

9. The motor driver according to claim 8, wherein the actual phase difference calculator circuit calculates an average value of the first actual phase difference, the second actual phase difference and the third actual phase difference as an actual average phase difference, and the error phase angle calculator circuit calculates a difference between the actual average phase difference and the reference phase difference as the error phase angle.

10. The motor driver according to claim 8, wherein the error phase angle calculator circuit calculates a difference between the first actual phase difference and the reference phase difference as a first error phase angle, and/or calculates a difference between the second actual phase difference and the reference phase difference as a second error phase angle, and/or calculates a difference between the third actual phase difference and the reference phase difference as a third error phase angle.

11. The motor driver according to claim 10, further comprising:
a storing circuit connected to the error phase angle calculator circuit, and configured to store the first error phase angle, the second error phase angle, the third error phase angle or any combination thereof.

12. The motor driver according to claim 11, wherein the motor driving circuit corrects the first commutation signal according to the first error phase angle, and/or corrects the second commutation signal according to the second error phase angle, and/or corrects the third commutation signal according to the third error phase angle.

13. The motor driver according to claim 12, wherein the motor driving circuit drives the motor according to the first error phase angle that is corrected, the second error phase angle that is corrected, the third error phase angle that is corrected or any combination thereof.

14. The motor driver according to claim 12, wherein the motor driving circuit calculates an average value of the first error phase angle, the second error phase angle and the third error phase angle, and corrects the first commutation signal, the second commutation signal, third commutation signal or any combination thereof according to the average value.

15. The motor driver according to claim 14, wherein the motor driving circuit drives the motor according to the first error phase angle that is corrected, the second error phase angle that is corrected, the third error phase angle that is corrected or any combination thereof.

\* \* \* \* \*